(12) United States Patent
Kamata

(10) Patent No.: US 10,961,627 B2
(45) Date of Patent: Mar. 30, 2021

(54) CONDENSATION SUPPRESSING METHOD AND PROCESSING SYSTEM

(71) Applicant: Tokyo Electron Limited, Tokyo (JP)

(72) Inventor: Koji Kamata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 85 days.

(21) Appl. No.: 16/295,116

(22) Filed: Mar. 7, 2019

(65) Prior Publication Data

US 2019/0276936 A1    Sep. 12, 2019

(30) Foreign Application Priority Data

Mar. 9, 2018    (JP) .............................. JP2018-042663

(51) Int. Cl.
| | | |
|---|---|---|
| *C23C 16/46* | (2006.01) | |
| *H01L 21/67* | (2006.01) | |
| *C23C 16/458* | (2006.01) | |
| *H01J 37/32* | (2006.01) | |
| *C23C 16/52* | (2006.01) | |
| *H01L 21/683* | (2006.01) | |

(52) U.S. Cl.
CPC ........ *C23C 16/466* (2013.01); *C23C 16/4586* (2013.01); *C23C 16/52* (2013.01); *H01J 37/32522* (2013.01); *H01J 37/32724* (2013.01); *H01J 37/32935* (2013.01); *H01L 21/67109* (2013.01); *H01L 21/67248* (2013.01); *H01L 21/67253* (2013.01); *H01L 21/6831* (2013.01); *H01L 21/6833* (2013.01)

(58) Field of Classification Search
CPC ... C23C 16/466; C23C 16/4586; C23C 16/52; H01J 37/32522; H01J 37/32724; H01J 37/32935; H01L 21/67248; H01L 21/67253; F24F 2110/20; F24F 2013/221
See application file for complete search history.

(56) References Cited

U.S. PATENT DOCUMENTS 5,267,450 A * 12/1993 Takegawa ............. F24F 1/0003
                                                                 62/176.2
2013/0077651 A1* 3/2013 Lee ................... H01L 21/67253
                                                                 374/28

FOREIGN PATENT DOCUMENTS

EP    2545979 A1 * 1/2013 ............ F24F 1/0358
JP    H07-169737 A    7/1995

* cited by examiner

*Primary Examiner* — Marc E Norman
*Assistant Examiner* — Schyler S Sanks
(74) *Attorney, Agent, or Firm* — Pearne & Gordon LLP

(57) ABSTRACT

Condensation on a member of a processing apparatus can be suppressed. A condensation suppressing method of suppressing condensation in a processing apparatus configured to perform a processing on a processing target object includes a first measurement process, a second measurement process and a first control process. In the first measurement process, a first surface temperature of a member of the processing apparatus, which is exposed within a closed space, is measured. In the second measurement process, a dew-point temperature of air within the closed space is measured. In the first control process, a supply amount of low-dew-point air, which has a dew-point temperature lower than a dew-point temperature of air outside the processing apparatus, into the closed space is controlled based on the first surface temperature and the dew-point temperature of the air within the closed space.

8 Claims, 10 Drawing Sheets

FIG. 8

| TEMPERATURE (°C) | HUMIDITY (%) | | | | | | |
|---|---|---|---|---|---|---|---|
| | 35% | 40% | 45% | 50% | 55% | 60% | 65% |
| 30 | 12.9 | 14.9 | 16.8 | 18.4 | 20.0 | 21.4 | 22.7 |
| 29 | 12.0 | 14.0 | 15.9 | 17.5 | 19.0 | 20.4 | 21.7 |
| 28 | 11.1 | 13.1 | 15.0 | 16.6 | 18.1 | 19.5 | 20.8 |
| 27 | 10.2 | 12.3 | 14.1 | 15.7 | 17.2 | 18.6 | 19.9 |
| 26 | 9.4 | 11.4 | 13.2 | 14.8 | 16.3 | 17.6 | 18.9 |
| 25 | 8.5 | 10.5 | 12.2 | 13.9 | 15.3 | 16.7 | 18.0 |
| 24 | 7.6 | 9.6 | 11.3 | 12.9 | 14.4 | 15.8 | 17.0 |
| 23 | 6.7 | 8.7 | 10.4 | 12.0 | 13.5 | 14.8 | 16.1 |
| 22 | 5.8 | 7.8 | 9.5 | 11.1 | 12.5 | 13.9 | 15.1 |
| 21 | 5.0 | 6.9 | 8.6 | 10.2 | 11.6 | 12.9 | 14.2 |
| 20 | 4.1 | 6.0 | 7.7 | 9.3 | 10.7 | 12.0 | 13.2 |
| 19 | 3.2 | 5.1 | 6.8 | 8.3 | 9.8 | 11.1 | 12.3 |
| 18 | 2.3 | 4.2 | 5.9 | 7.4 | 8.8 | 10.1 | 11.3 |
| 17 | 1.4 | 3.3 | 5.0 | 6.5 | 7.9 | 9.2 | 10.4 |
| 16 | 0.6 | 2.4 | 4.1 | 5.6 | 7.0 | 8.2 | 9.4 |
| 15 | -0.3 | 1.5 | 3.2 | 4.7 | 6.1 | 7.3 | 8.5 |
| 14 | -1.2 | 0.6 | 2.3 | 3.7 | 5.1 | 6.4 | 7.5 |
| 13 | -2.1 | -0.3 | 1.3 | 2.8 | 4.2 | 5.5 | 6.6 |
| 12 | -3.0 | -1.2 | 0.4 | 1.9 | 3.2 | 4.5 | 5.6 |
| 11 | -3.8 | -2.1 | -0.4 | 1.0 | 2.3 | 3.5 | 4.7 |
| 10 | -4.7 | -3.0 | -1.2 | 0.1 | 1.4 | 2.6 | 3.7 |

CONDENSATION SUPPRESSING METHOD AND PROCESSING SYSTEM

CROSS-REFERENCE TO RELATED APPLICATION

This application claims the benefit of Japanese Patent Application No. 2018-042663 filed on Mar. 9, 2018, the entire disclosure of which is incorporated herein by reference.

TECHNICAL FIELD

The various aspects and embodiments described herein pertain generally to a condensation suppressing method and a processing system.

BACKGROUND

In a processing system configured to perform a preset processing on a semiconductor wafer (hereinafter, simply referred to as "wafer") by using plasma, the semiconductor wafer is regulated to have a predetermined temperature. Since the semiconductor wafer is heated by the plasma, the semiconductor wafer needs to be cooled to maintain the temperature of the semiconductor wafer at the predetermined temperature in the process using the plasma. For example, by allowing a coolant of a low temperature lower than a room temperature to be flown within a placing table on which the wafer is placed, the semiconductor wafer is cooled via the placing table.

Since, however, a temperature of the placing table falls below the room temperature due to the coolant flown therein, condensation may occur at a portion of the placing table which is in contact with exterior air. Further, even another component in contact with the placing table may be deprived of heat by the placing table and a temperature of that component may fall under the room temperature. This component may also suffer the condensation at a portion thereof which is in contact with the exterior air. If the condensation takes place in the processing system, an electrical component may break down due to moisture generated by the condensation.

To avoid this problem, there is known a technique of suppressing the condensation by protecting, with a thermal insulator, a surface of the component which might suffer from the condensation or through heating the component by a heating device such as a heater (see, for example, Patent Document 1).

Patent Document 1: Japanese Patent Laid-open Publication No. H07-169737

If, however, the component the temperature of which falls below the room temperature is heated, the heat may be transferred to the coolant via the corresponding component, resulting in degradation of cooling performance by the coolant. Further, in case of suppressing the condensation by using the thermal insulator or the heating device, a space for accommodating the thermal insulator or the heating device is required. Thus, it may be difficult to achieve scale-down of a processing apparatus.

SUMMARY

In an exemplary embodiment, there is provided a condensation suppressing method of suppressing condensation in a processing apparatus configured to perform a processing on a processing target object. The condensation suppressing method includes a first measurement process, a second measurement process and a first control process. In the first measurement process, a first surface temperature of a member of the processing apparatus, which is exposed within a closed space, is measured. In the second measurement process, a dew-point temperature of air within the closed space is measured. In the first control process, a supply amount of low-dew-point air, which has a dew-point temperature lower than a dew-point temperature of air outside the processing apparatus, into the closed space is controlled based on the first surface temperature and the dew-point temperature of the air within the closed space.

According to the exemplary embodiment, the condensation on the member of the processing apparatus can be suppressed.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 8 is a an example of a dew-point temperature table;

DETAILED DESCRIPTION

Figure 1:
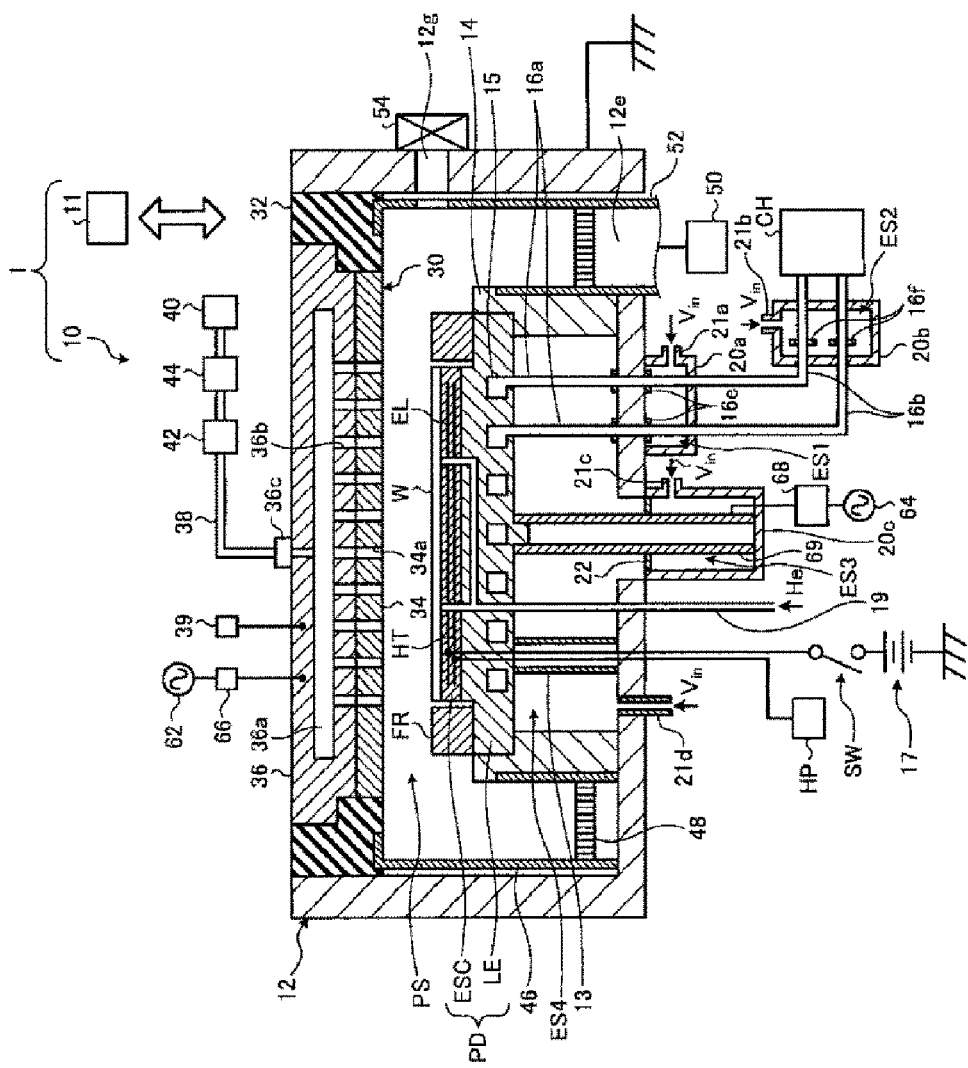
FIG. 1 is a configuration view illustrating an example of a processing system according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a condensation suppressing method and a processing system will be described in detail with reference to the accompanying drawings. Here, however, it should be noted once again that the exemplary embodiments are not limiting.

First Exemplary Embodiment

[Configuration of Processing System 1]

FIG. 1 is a configuration view illustrating an example of a processing system 1 according to a first exemplary embodiment. The processing system 1 includes a processing apparatus 10 and a control device 11. The processing apparatus 10 is provided in, for example, a clean room. The processing apparatus 10 is configured as a plasma etching apparatus having parallel plate type electrodes, and is equipped with a processing vessel 12. The processing vessel 12 is made of, by way of non-limiting example, a material such as aluminum, and has a substantially cylindrical shape. Further, an inner wall surface of the processing vessel 12 is anodically oxidized. Furthermore, the processing vessel 12 is frame-grounded.

A substantially cylindrical supporting member 14 made of an insulating material such as, but not limited to, quartz is provided on the bottom of the processing vessel 12. The supporting member 14 is vertically extended from the bottom of the processing vessel 12 (toward an upper electrode 30) within the processing vessel 12.

The placing table PD is provided within the processing vessel 12. The placing table PD is supported by the supporting member 14. The placing table PD holds a wafer W on a top surface thereof. The wafer W is an example of a processing target object. The placing table PD includes a lower electrode LE and an electrostatic chuck ESC. The lower electrode LE is made of a metal such as, but not limited to, aluminum, and has a substantially disk shape. The electrostatic chuck ESC is provided on the lower electrode LE.

The electrostatic chuck ESC has a structure in which an electrode EL made of a conductive film is embedded between a pair of insulating layers or insulating sheets. The electrode of the electrostatic chuck ESC is electrically connected to a DC power supply 17 via a switch SW. The electrostatic chuck ESC is configured to attract the wafer W on a top surface thereof by an electrostatic force such as a Coulomb force generated by a DC voltage applied from the DC power supply 17. Accordingly, the electrostatic chuck ESC is capable of holding the wafer W A heat transfer gas such as, by way of example, a He gas is supplied into the electrostatic chuck ESC via a pipe 19. The heat transfer gas supplied through the pipe 19 is supplied into a gap between the top surface of the electrostatic chuck ESC and a rear surface of the wafer W. By adjusting a pressure of the heat transfer gas supplied into the gap between the top surface of the electrostatic chuck ESC and the rear surface of the wafer W, thermal conductivity between the electrostatic chuck ESC and the wafer W can be adjusted.

A heater HT as a heating device is provided within the electrostatic chuck ESC. The heater HT is connected to a heater power supply HP. As a power is supplied to the heater HT from the heater power supply HP, the wafer W on the electrostatic chuck ESC can be heated through the electrostatic chuck ESC. A temperature of the wafer W placed on the electrostatic chuck ESC is adjusted by being cooled by the lower electrode LE and by being heated by the heater HT. Further, the heater HT may be provided between the electrostatic chuck ESC and the lower electrode LE.

Around the electrostatic chuck ESC, a focus ring FR is placed to surround an edge of the wafer W and the electrostatic chuck ESC. The focus ring FR is configured to improve uniformity of a processing upon the wafer W within a surface thereof. The focus ring FR is made of a material, such as quartz, which is appropriately selected based on a material of an etching target film.

Formed within the lower electrode LE is a path 15 through which a coolant such as Galden flows. The path 15 is connected to a chiller unit CH via internal pipes 16a. A temperature of the coolant is lower than a room temperature, for example, equal to or less than 0° C. As a specific example, the temperature of the coolant may be −60° C. As the coolant supplied from the chiller unit CH is circulated within the path 15 of the lower electrode LE, the lower electrode LE is cooled by a heat exchange between the coolant and the lower electrode LE. As the lower electrode LE is cooled, the wafer W placed on the electrostatic chuck ESC is cooled through the electrostatic chuck ESC.

The internal pipes 16a are connected to external pipes 16b provided at an outside of the processing vessel 12. The external pipes 16b are connected to the chiller unit CH. Each external pipe 16b is, by way of example, a vacuum insulation pipe. Joint portions 16e between the internal pipes 16a and the external pipes 16b are surrounded by the bottom of the processing vessel 12 and a housing 20a. This space surrounded by the bottom of the processing vessel 12 and the housing 20a is defined as a closed space ES1. The closed space ES1 has airtightness in which an air flow between the inside and the outside of the closed space ES1 is restricted to some extent. The housing 20a is provided with an inlet port 21a through which dry air supplied from a dry air supply device to be described later is introduced into the closed space ES1.

Further, the external pipe 16b is an assembly of a plurality of vacuum insulation pipes. Joint portions 16f between the plurality of vacuum insulation pipes are surrounded by a housing 20b. This space surrounded by the housing 20b is defined as a closed space ES2. The closed space ES2 has airtightness in which an air flow between the inside and the outside of the closed space ES2 is restricted to some extent. The housing 20b is provided with an inlet port 21b through which the dry air supplied from the dry air supply device to be described later is introduced into the closed space ES2.

Here, since the external pipe 26b is the vacuum insulation pipe, condensation hardly occurs even if a low-temperature coolant flows within the external pipe 26b. However, condensation may occur at the joint portions 16e and 16f where the vacuum insulation pipes are connected to other vacuum insulation pipes. As a resolution, in the present exemplary embodiment, the joint portions 16e and 16f are surrounded by the housings 20a and 20b, respectively, and the dry air is supplied into the housing 20a and 20b. Accordingly, a dew-point temperature of the air within the housing 20a and 20b is lowered, so that the condensation at the joint portions 16e and 16f is suppressed.

A closed space ES4 surrounded by a bottom surface of the lower electrode LE, an inner sidewall of the supporting member 14 and the bottom of the processing vessel 12 is provided under the lower electrode LE. The closed space ES4 has airtightness in which an air flow between the inside and the outside of the closed space ES4 is restricted to some extent. An inlet port 21d through which the dry air from the dry air supply device to be described later is introduced into the closed space ES4 is provided at the bottom of the processing vessel 12. Placed within the closed space ES4 are a pipe 13 through which an electric wiring passes, the pipe 19 through which the heat transfer gas is flown, a power feed pipe 69 through which a high frequency power is applied to the lower electrode LE, and the internal pipes 16a through which the coolant is flown. Further, though not shown in FIG. 1, a driving device of pusher pins for performing a delivery of the wafer W on the electrostatic chuck ESC, and so forth may also be placed within the closed space ES4.

Here, the lower electrode LE is cooled by the coolant supplied from the chiller unit CH. Accordingly, condensation may occur at a portion of the surface of the lower electrode LE which is contact with the air. To solve the problem, in the present exemplary embodiment, by supplying the dry air into the closed space ES4 under the lower electrode LE, a dew-point temperature of the air within the closed space ES4 is lowered. As a result, condensation on a surface of a member exposed to the closed space ES4 can be suppressed from occurring.

An upper electrode 30 is provided above the placing table PD, facing the placing table PD. The lower electrode LE and the upper electrode 30 are arranged to be substantially parallel to each other. A space between the upper electrode 30 and the lower electrode LE is a processing space PS in which a plasma processing is performed on the wafer W.

The upper electrode 30 is supported at an upper portion of the processing vessel 12 with an insulating shield member 32 made of, by way of example, quartz therebetween. The upper electrode 30 includes an electrode plate 34 and an electrode supporting body 36. A bottom surface of the electrode plate 34 is directly contacted with the processing space PS, and the electrode plate 34 is provided with a multiple number of gas discharge holes 34a. The electrode plate 34 is made of, by way of example, a material including silicon.

The electrode supporting body 36 is made of a conductive material such as, but not limited to, aluminum and configured to support the electrode plate 34 in a detachable manner. The electrode supporting body 36 may have a non-illustrated water-cooling structure. A gas diffusion space 36a is provided within the electrode supporting body 36. A multiple number of gas holes 36b are extended downwards (towards the placing table PD) from the gas diffusion space 36a to communicate with the gas discharge holes 34a of the electrode plate 34, respectively. The electrode supporting body 36 is provided with a gas inlet port 36c through which the processing gas is introduced into the gas diffusion space 36a, and a pipe 38 is connected to the gas inlet port 36c.

The pipe 38 is connected to a gas source group 40 via a valve group 42 and a flow rate controller group 44. The gas source group 40 includes a plurality of gas sources. The valve group 42 includes a plurality of valves, and the flow rate controller group 44 includes a plurality of flow rate controllers such as mass flow controllers. Each of the gas sources belonging to the gas source group 40 is connected to the pipe 38 via a corresponding valve belonging to the valve group 42 and a corresponding flow rate controller belonging to the flow rate controller group 44.

With this configuration, the processing apparatus 10 is capable of supplying a gas from one or more gas sources selected from the plurality of gas sources belonging to the gas source group 40 into the gas diffusion space 36a of the electrode supporting body 36 at individually controlled flow rates. The gas supplied into the gas diffusion space 36a is diffused within the gas diffusion space 36a to be supplied into the processing space PS through the gas holes 36b and the gas discharge holes 34a.

The upper electrode 30 is connected to a power supply 39. The power supply 39 is configured to apply, to the upper electrode 30, a voltage for attracting positive ions in the processing space PS toward the electrode plate 34. As an example, the power supply 39 is a DC power supply configured to generate a negative DC voltage. As such a voltage is applied to the upper electrode 30 from the power supply 39, the positive ions existing in the processing space PS collide with the electrode plate 34. Accordingly, either or both of secondary electrons and silicon are released from the electrode plate 34.

A deposition shield 46 made of, for example, aluminum coated with a $Y_2O_3$, quartz or the like is provided on an inner wall surface of the processing vessel 12 and an outer side surface of the supporting member 14 in a detachable manner. The deposition shield 46 is configured to suppress an etching byproduct (deposit) from adhering to the processing vessel 12.

At a bottom side of the processing vessel 12 (where the supporting member 14 is provided), a gas exhaust plate 48 made of, for example, aluminum coated with a $Y_2O_3$, quartz or the like is provided between the supporting member 14 and the inner sidewall of the processing vessel 12. A gas exhaust opening 12e is provided under the gas exhaust plate 48. The gas exhaust opening 12e is connected with a gas exhaust device 50 via a gas exhaust line 52.

The gas exhaust device 50 includes a vacuum pump such as a turbo molecular pump, and is capable of decompressing the space within the processing vessel 12 to a required vacuum level. Further, an opening 12g for carry-in/carry-out of the wafer W is provided at the sidewall of the processing vessel 12, and the opening 12g is opened or closed by a gate valve 54.

The processing apparatus 10 further includes a first high frequency power supply 62 and a second high frequency power supply 64. The first high frequency power supply 62 is configured to generate a high frequency power for plasma generation having a frequency ranging from, e.g., 27 MHz to 100 MHz, for example, 60 MHz. The first high frequency power supply 62 is connected to the upper electrode 30 via a matching device 66. The matching device 66 is a circuit configured to match an output impedance of the first high frequency power supply 62 and an input impedance at a load side (upper electrode 30 side). The high frequency power generated by the first high frequency power supply 62 is applied to the upper electrode 30 via the matching device 66. The first high frequency power supply 62 may be connected to the lower electrode LE via the matching device 66.

The second high frequency power supply 64 is configured to generate a high frequency power for ion attraction into the wafer W, that is, a high frequency bias power. For example, the second high frequency power supply 64 generates a high frequency bias power having a frequency ranging from 400 kHz to 40.68 MHz, for example, 13.56 MHz. The second high frequency power supply 64 is connected, via a matching device 68, to the power feed pipe 69 which is made of a metal. The power feed pipe 69 is connected to the lower electrode LE. The matching device 68 is a circuit configured to match an output impedance of the second high frequency power supply 64 and an input impedance at a load side (lower electrode LE side). The high frequency bias power generated by the second high frequency power supply 64 is applied to the lower electrode LE via the matching device 68 and the power feed pipe 69.

A lower portion of the power feed pipe 69 is surrounded by the housing 20c. This space surrounded by the housing 20c is defined as a closed space ES3. A partition plate 22 is provided between the closed space ES3 and the closed space ES4. The closed space ES3 has airtightness in which an air flow between the inside and the outside of the closed space ES3 is restricted to some extent. The housing 20c is provided with an inlet port 21c through which the dry air supplied from the dry air supply device to be described later is introduced into the closed space ES3.

Here, the power feed pipe 69 is connected to the lower electrode LE, and the lower electrode LE is cooled by the coolant supplied from the chiller unit CH. Accordingly, the power feed pipe 69 is also cooled through the lower electrode LE, so that condensation may occur on a surface of the power feed pipe 69 which is contact with the air. Since the electronic components such as the second high frequency power supply 64 and the matching device 68 are connected to the power feed pipe 69, these electronic components such as the second high frequency power supply 64 and the matching device 68 may be broken if moisture is generated due to the condensation on the power feed pipe 69. In the present exemplary embodiment, to solve the problem, by supplying the dry air into the housing 20c, a dew-point temperature of the air within the housing 20c is lowered. Therefore, the condensation on the surface of the power feed pipe 69 within the housing 20c can be suppressed from occurring.

The control device 11 is equipped with a processor, a memory and an input/output interface. The memory stores therein programs to be executed by the processor and recipes including conditions for various processings and the like. The processor executes the programs read out from the memory and controls the individual components of the processing apparatus 10 via the input/output interface based on the recipes stored in the memory, thus allowing a preset processing such as etching to be performed on the wafer W. The control device 11 is an example of a control unit.

[Supplying Method of Dry Air]

Figure 2:
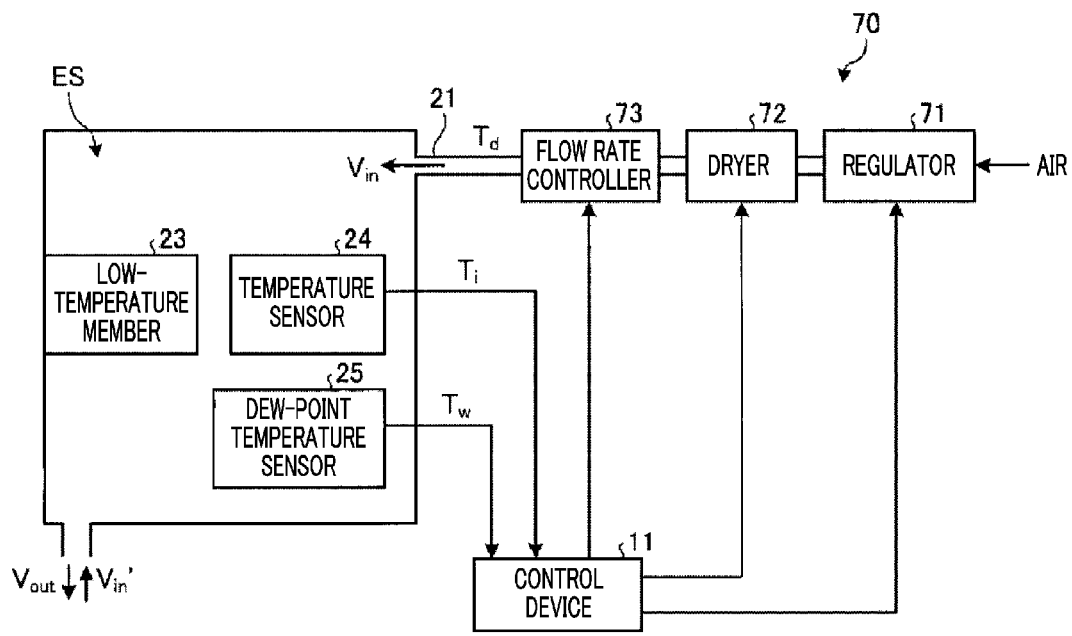
FIG. 2 is a schematic diagram illustrating an example of a supplying method of dry air into a closed space.

FIG. 2 is a schematic diagram illustrating an example supplying method of dry air into a closed space ES. In FIG. 2, the closed space ES represents the individual closed spaces ES1 to ES4 shown in FIG. 1. Further, in FIG. 2, an inlet port 21 represents the individual inlet ports 21a to 21d shown in FIG. 1, and $V_{in}$ denotes a flow rate of the dry air supplied into the closed space ES through the inlet port 21. Furthermore, in FIG. 2, $V_{out}$ denotes a flow rate of air escaping from the inside of the closed space ES to the outside of the closed space ES, and $V_{in}'$ denotes a flow rate of air entering the closed space ES from the outside of the closed space ES via a gap other than the inlet port 21.

Further, in FIG. 2, a low-temperature member 23 is a member at least a part of a surface of which is exposed to the closed space ES. This low-temperature member 23 is regulated to have a low temperature lower than a room temperature (e.g., +25° C.) by the coolant supplied from the chiller unit CH. A temperature sensor 24 and a dew-point temperature sensor 25 are provided within the closed space ES.

The temperature sensor 24 is configured to measure a temperature $T_i$ of a surface of the low-temperature member 23 and outputs data of the measured temperature $T_i$ to the control device 11. In the present exemplary embodiment, the temperature sensor 24 is, for example, a fluorescence-type temperature sensor using an optical fiber, and measures the temperature $T_i$ of the surface of the member having the lowest temperature within the closed space ES. The temperature $T_i$ of the surface of the member having the lowest temperature within the closed space ES is an example of a first surface temperature. The dew-point temperature sensor 25 measures a dew-point temperature $T_w$ of the air within the closed space ES and outputs data of the measured dew-point temperature $T_w$ to the control device 11. The temperature sensor 24 is an example of a first measuring unit, and the dew-point temperature sensor 25 is an example of a second measuring unit.

Further, the temperature sensor 24 may measure a temperature $T_i$ of a surface of any member within the closed space ES. For example, the control device 11 specifies a temperature difference between a position where the temperature $T_i$ is measured by the temperature sensor 24 and a position having the lowest temperature based on data of temperature distribution of the surface of the member when the member has a low-temperature state. Then, the control device 11 measures, as the temperature $T_i$ of the surface of the member having the lowest temperature within the closed space ES, a temperature obtained by subtracting the specified temperature difference from the temperature $T_i$ measured by the temperature sensor 24. The data of the temperature distribution is previously measured to be stored in the memory of the control device 11.

Dry air supplied into the closed space ES is generated by a dry air supply device 70. The dry air supply device 70 includes a regulator 71, a dryer 72 and a flow rate controller 73. The regulator 71 introduces air outside the processing apparatus 10 (that is, within the clean room) and adjusts a pressure of the introduced air. The processing performed by the regulator 71 is an example of an introduction process. The dryer 72 generates the dry air, which is air having a low dew-point temperature, by removing moisture of the air by using, for example, a hollow fiber membrane or the like. The processing performed by the dryer 72 is an example of a generation process. The dew-point temperature of the dry air generated by the dryer 72 is defined as $T_d$. The dry air is an example of low dew-point air.

The flow rate controller 73 supplies the dry air generated by the dryer 72 into the closed space ES at the flow rate $V_{in}$ set in response to the control signal from the control device 11. In the present exemplary embodiment, flow rate controllers 73 are provided for the closed spaces ES1 to ES4 in one-to-one correspondence. For the closed spaces ES1 to ES4, the control device 11 supplies control signals to the corresponding flow rate controllers 73 individually. Accordingly, the flow rate $V_{in}$ of the supplied dry air is adjusted for each of the closed spaces ES1 to ES4, individually. The flow rate controller 73 is an example of a supplying unit.

Figure 3:
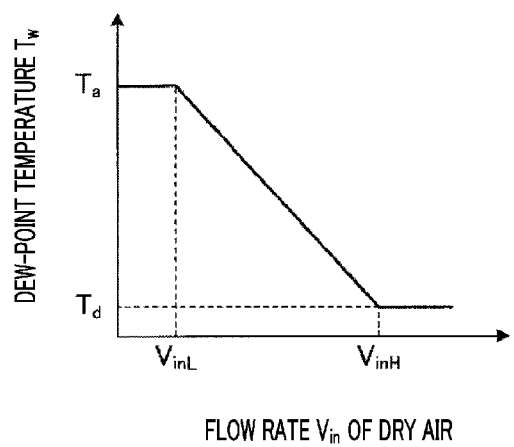
FIG. 3 is a diagram showing an example of a relationship between a flow rate of the dry air supplied into the closed space and a dew-point temperature within the closed space.

FIG. 3 is a diagram showing an example of a relationship between the flow rate $V_{in}$ of the dry air supplied into the closed space ES and the dew-point temperature $T_w$ within the closed space ES. Since the closed space ES is not completely sealed, though it has some degree of airtightness, the air within the closed space ES leaks out at the flow rate $V_{out}$ and air is introduced into the closed space ES from the outside at the flow rate $V_{in}'$.

If the dry air is not supplied into the closed space ES, the air outside the closed space ES flows into the closed space ES. Accordingly, the dew-point temperature $T_w$ within the closed space ES becomes equal to a dew-point temperature $T_a$ of the air outside the closed space ES. If the dry air is supplied into the closed space ES, the flow rate $V_{in}'$ of the air flown into the closed space ES is reduced, so that a proportion of the dry air in the air within the closed space ES is increased. If, however, the flow rate $V_{in}$ of the supplied dry air is small, the supplied dry air may leak to the outside of the closed space ES before being diffused therein, so that the dew-point temperature $T_w$ within the closed space ES hardly changes.

If the flow rate $V_{in}$ of the dry air supplied into the closed space ES is further increased to exceed a preset flow rate $V_{inL}$, the amount of the dry air diffused within the closed space ES is increased, so that the proportion of the dry air in the air within the closed space ES is increased. As a result, the dew-point temperature $T_w$ of the air within the closed space ES is decreased.

If the flow rate $V_{in}$ of the dry air supplied into the closed space ES is still further increased to exceed a preset flow rate $V_{inH}$, the flow rate $V_{in}'$ of the air introduced into the closed space ES becomes zero (0), so that the closed space ES is fully filled with the dry air. As a result, the dew-point temperature $T_w$ within the closed space ES becomes equal to the dew-point temperature $T_d$ of the dry air.

[Processing Flow]

Figure 4:
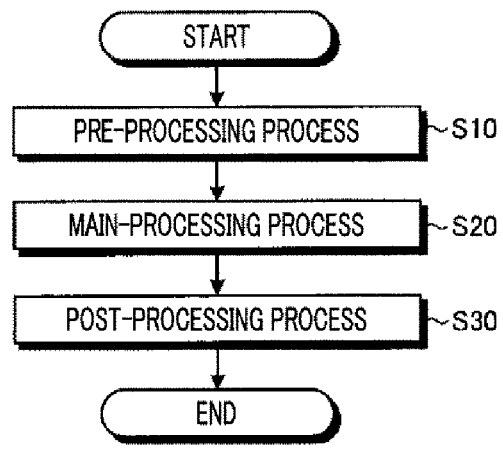
FIG. 4 is a flowchart illustrating an example of a processing performed by the processing system.

FIG. 4 is a flowchart illustrating an example of a processing performed by the processing system 1. The processing shown in FIG. 4 is an example of a condensation suppressing method.

First, the processing system 1 performs a pre-processing process which is performed before a processing upon the wafer W is begun by using the processing apparatus 10 (S10). Then, the processing system 1 performs a main-processing process in which a processing such as etching is performed on the wafer W by using the processing apparatus 10 (S20). Thereafter, the processing system 1 performs a post-processing process which is performed after the processing upon the wafer W is completed (S30).

[Pre-Processing Process]

Figure 5:
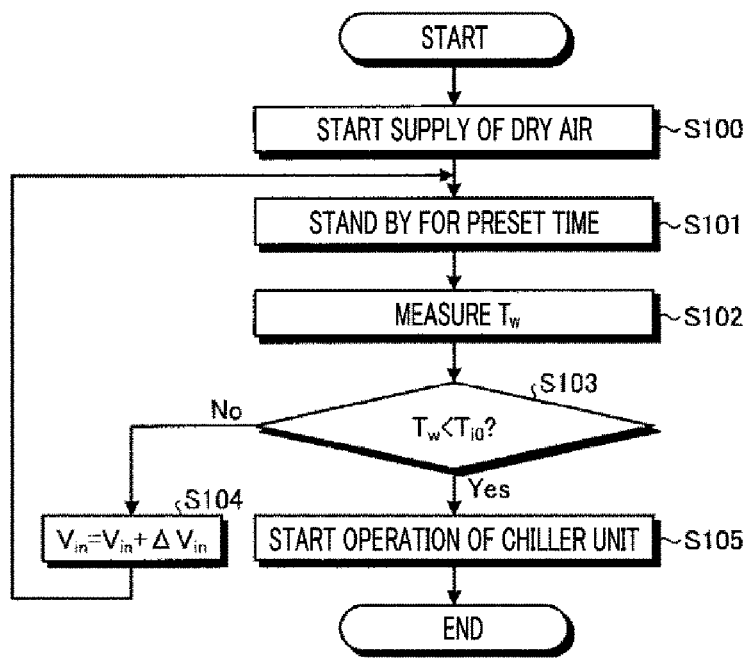
FIG. 5 is a flowchart illustrating an example of a pre-processing process.

FIG. 5 is a flowchart showing an example of the pre-processing process. Although FIG. 5 illustrates a processing in the single closed space ES, the same processing is performed in the other closed spaces ES.

First, the control device 11 starts a supply of the dry air into the closed space ES by controlling the dry air supply device 70 (S100). In the process S100, the control device 11 outputs a control signal indicating an initial value of the flow rate $V_{in}$ of the dry air to the flow rate controller 73 configured to supply the dry air into the closed space ES. For example, the initial value of the flow rate $V_{in}$ of the dry air may be a medium value between the flow rate $V_{inL}$ and the flow rate $V_{inH}$.

Then, the control device 11 stands by for a preset time (ranging from, for example, several seconds to several minutes) until air convection within the closed space ES is stabilized and a measurement value of the dew-point temperature sensor 25 is stabilized (S101). Then, the control device 11 measures the dew-point temperature $T_w$ by acquiring data of the dew-point temperature $T_w$ of the air within the closed space ES, which is outputted from the dew-point temperature sensor 25 (S102). The process S102 is an example of a third measurement process.

Subsequently, the control device 11 determines whether the measured dew-point temperature $T_w$ is lower than a preset temperature $T_{i0}$ (S103). By way of example, the preset temperature $T_{i0}$ may be the lowest temperature where the low-temperature member 23 within the closed space ES reaches during the processing upon the wafer W. Further, the preset temperature $T_{i0}$ may be a set temperature of the coolant in the processing upon the wafer W. The process S103 is an example of a first determination process.

If the dew-point temperature $T_w$ is equal to or higher than the preset temperature $T_{i0}$ (S103: No), the control device 11 outputs, to the flow rate controller 73, a control signal for increasing the flow rate $V_{in}$ of the dry air supplied into the closed space ES by a predetermined flow rate $\Delta V_{in}$ (S104). As a result, the flow rate $V_{in}$ of the dry air supplied into the closed space ES is increased by the predetermined flow rate $\Delta V_{in}$. Then, the control device 11 performs the process S101 again. The process S104 is an example of a second control process.

Meanwhile, if the dew-point temperature $T_w$ is lower than the preset temperature $T_{i0}$ (S103: Yes), the control device 11 instructs the chiller unit CH to set the temperature of the coolant based on a recipe and starts an operation of the chiller unit CH (S105). The process S105 is an example of an operation starting process.

As stated above, before the operation of the chiller unit CH is begun, the dew-point temperature $T_w$ of the air within the closed space ES is set to be lower than the lowest temperature where the low-temperature member 23 within the closed space ES reaches during the processing upon the wafer W. Accordingly, the processing upon the wafer W can be begun in the state that condensation on the low-temperature member 23 has not taken place.

[Main-Processing Process]

Figure 6:
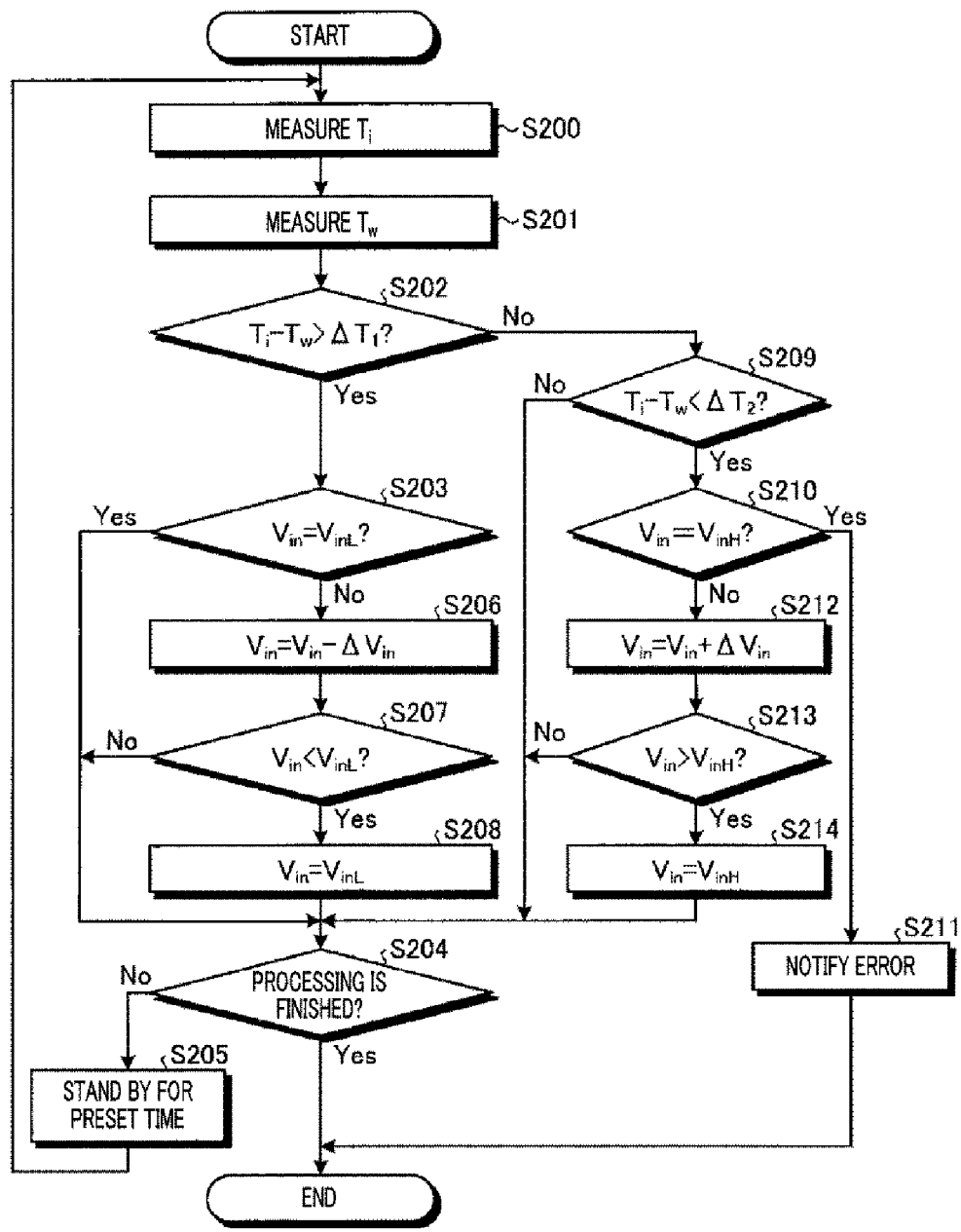
FIG. 6 is a flowchart illustrating an example of a main-processing process.

FIG. 6 is a flowchart illustrating an example of the main-processing process. Although FIG. 6 illustrates a processing in the single closed space ES, the same processing is performed in the other closed spaces ES.

First, the control device 11 measures the temperature $T_i$ of the low-temperature member 23 by acquiring data of the temperature $T_i$ of the surface of the low-temperature member 23, which is outputted from the temperature sensor 24 (S200). The process S200 is an example of a first measurement process. Then, the control device 11 measures the dew-point temperature $T_w$ of the air within the closed space ES by acquiring data of the dew-point temperature $T_w$ of the air within the closed space ES, which is outputted from the dew-point temperature sensor 25 (S201). The process S201 is an example of a second measurement process. Then, the control device 11 determines whether a value obtained by subtracting the dew-point temperature $T_w$ from the temperature $T_i$ of the low-temperature member 23 is larger than a first temperature difference $\Delta T_1$ (S202).

Here, the first temperature difference $\Delta T_1$ will be explained. The temperature $T_i$ of the surface of the low-temperature member 23 measured by the temperature sensor 24 provided in the closed space ES includes a measurement error caused by the temperature sensor 24. Further, the dew-point temperature $T_w$ of the air within the closed space ES measured by the dew-point temperature sensor 25 provided in the closed space ES includes a measurement error caused by the dew-point temperature sensor 25. Even if these measurement errors are included, the condensation that might occur in the low-temperature member 23 needs to be suppressed. Thus, in the present exemplary embodiment, a sum of a maximum measurement error of the temperature sensor 24 and a maximum measurement error of the dew-point temperature sensor 25 is previously stored as a threshold value. In the present exemplary embodiment, the threshold value may be, e.g., 3.5° C.

Then, a value obtained by adding a preset offset to the stored threshold value is used as the first temperature difference $\Delta T_1$. The offset may be, e.g., 1.0° C. Thus, in the present exemplary embodiment, the first temperature difference $\Delta T_1$ is, e.g., 4.5° C. Further, the stored threshold value is used as a second temperature difference $\Delta T_2$ to be described later. In the present exemplary embodiment, the second temperature difference $\Delta T_2$ may be, e.g., 3.5° C.

Referring back to FIG. 6, if the value calculated by subtracting the dew-point temperature $T_w$ from the temperature $T_i$ of the low-temperature member 23 is larger than the first temperature difference $\Delta T_1$ (S202: Yes), the control device 11 determines whether the flow rate $V_{in}$ of the dry air supplied into the closed space ES is the flow rate $V_{inL}$ (S203). Here, in the present exemplary embodiment, the supply of the dry air into the closed space ES is continued at the flow rate $V_{inL}$ even if the flow rate $V_{in}$ of the dry air into the closed space ES is reduced. Thus, it is possible to reduce the dew-point temperature $T_w$ within the closed space ES promptly when it is needed to reduce the dew-point temperature $T_w$ within the closed space ES.

If the flow rate $V_{in}$ of the dry air is the flow rate $V_{inL}$ (S203: Yes), the control device 11 determines, without changing the flow rate $V_{in}$ of the dry air, whether the processing upon the wafer W is finished (S204). If the processing upon the wafer W is not finished (S204: No), the control device 11 stands by for a preset time (ranging from, for example, several seconds to several minutes) (S205) and performs the process S200 again. Meanwhile, if the processing upon the wafer W is finished (S204: Yes), the control device 11 ends the processing shown in the present flowchart. Further, even if the processing shown in the present flowchart is ended, the supply of the dry air into the closed space ES is continued at the flow rate $V_{in}$ ranging from the flow rate $V_{inL}$ to the flow rate $V_{inH}$.

If the flow rate $V_{in}$ of the dry air is not the flow rate $V_{inL}$ (S203: No), the control device 11 calculates the flow rate $V_{in}$ of the dry air which is reduced by the preset flow rate $\Delta V_{in}$ (S206). Then, the control device 11 determines whether the calculated flow rate $V_{in}$ is smaller than the flow rate $V_{inL}$ (S207).

If the calculated flow rate $V_{in}$ is equal to or larger than the flow rate $V_{inL}$ (S207: No), the control device 11 outputs a control signal indicating the calculated flow rate $V_{in}$ to the flow rate controller 73. Accordingly, the flow rate $V_{in}$ of the dry air supplied into the closed space ES is decreased by the preset flow rate $\Delta V_{in}$. Then, the control device 11 performs the process S204.

Meanwhile, if the calculated flow rate $V_{in}$ is smaller than the flow rate $V_{inL}$ (S207: Yes), the control device 11 generates a control signal instructing that the flow rate $V_{inL}$ is set as the flow rate $V_{in}$ (S208). Then, the control device 11 outputs the generated control signal to the flow rate controller 73. Accordingly, the flow rate $V_{in}$ of the dry air supplied into the closed space ES is adjusted to the flow rate $V_{inL}$. Then, the control device 11 performs the process S204. The processes S202, S204, S207 and S208 are an example of a first control process.

If the value obtained by subtracting the dew-point temperature $T_w$ from the temperature $T_i$ of the low-temperature member 23 is equal to or less than the first temperature difference $\Delta T_1$ (S202: No), the control device 11 determines whether the value obtained by subtracting the dew-point temperature $T_w$ from the temperature $T_i$ is smaller than the second temperature difference $\Delta T_2$ (S209). If the value obtained by subtracting the dew-point temperature $T_w$ from the temperature $T_i$ is equal to or larger than the second temperature difference $\Delta T_2$ (S209: No), that is, if the value obtained by subtracting the dew-point temperature $T_w$ from the temperature $T_i$ falls between the first temperature difference $\Delta T_1$ and the second temperature difference $\Delta T_2$, the control device 11 performs the process S204. In this case, the flow rate $V_{in}$ of the dry air is not changed.

Meanwhile, if the value obtained by subtracting the dew-point temperature $T_w$ from the temperature $T_i$ is smaller than the second temperature difference $\Delta T_2$ (S209: Yes), the control device 11 determines whether the flow rate $V_{in}$ of the dry air is the flow rate $V_{inH}$ (S210). If the flow rate $V_{in}$ of the dry air is the flow rate $V_{inH}$ (S210: Yes), the control device 11 notifies a manager of the processing system 1 of an error while maintaining the flow rate $V_{in}$ of the dry air to be the flow rate $V_{inH}$ (S211), and ends the processing shown in the present flowchart.

Meanwhile, if the flow rate $V_{in}$ of the dry air is not the flow rate $V_{inH}$ (S210: No), the control device 11 calculates the flow rate $V_{in}$ of the dry air increased by the preset flow rate $\Delta V_{in}$ (S212). Then, the control device 11 determines whether the calculated flow rate $V_{in}$ is larger than the flow rate $V_{inH}$ (S213). If the calculated flow rate $V_{in}$ is equal to or less than the flow rate $V_{inH}$ (S213: No), the control device 11 outputs a control signal indicating the calculated flow rate $V_{in}$ to the flow rate controller 73. Accordingly, the flow rate $V_{in}$ of the dry air supplied into the closed space ES is increased by the preset flow rate $\Delta V_{in}$. Then, the control device 11 performs the process S204.

Meanwhile, if the calculated flow rate $V_{in}$ is larger than the flow rate $V_{inH}$ (S213: Yes), the control device 11 generates a control signal instructing that the flow rate $V_{inH}$ is set as the flow rate $V_{in}$ (S214). Then, the control device 11 outputs the generated control signal to the flow rate controller 73. Accordingly, the flow rate $V_{in}$ of the dry air supplied into the closed space ES is adjusted to the flow rate $V_{inH}$. Then, the control device 11 performs the process S204.

Here, as depicted in FIG. 3, for example, even if the dry air is supplied into the closed space ES at the flow rate $V_{in}$ exceeding the flow rate $V_{inH}$, the dew-point temperature $T_w$ of the air within the closed space ES does not fall below the dew-point temperature $T_d$ of the dry air. Therefore, if the dry air is supplied into the closed space ES at the flow rate $V_{in}$ exceeding the flow rate $V_{inH}$, the dry air is consumed unnecessarily. In view of this, in the present exemplary embodiment, as shown in the process S214, the control device 11 does not increase the flow rate $V_{in}$ of the dry air any more in case that the flow rate $V_{in}$ of the dry air currently supplied reaches the flow rate $V_{inH}$. Accordingly, the control device 11 is capable of suppressing unnecessary consumption of the dry air.

[Post-Processing Process]

Figure 7:
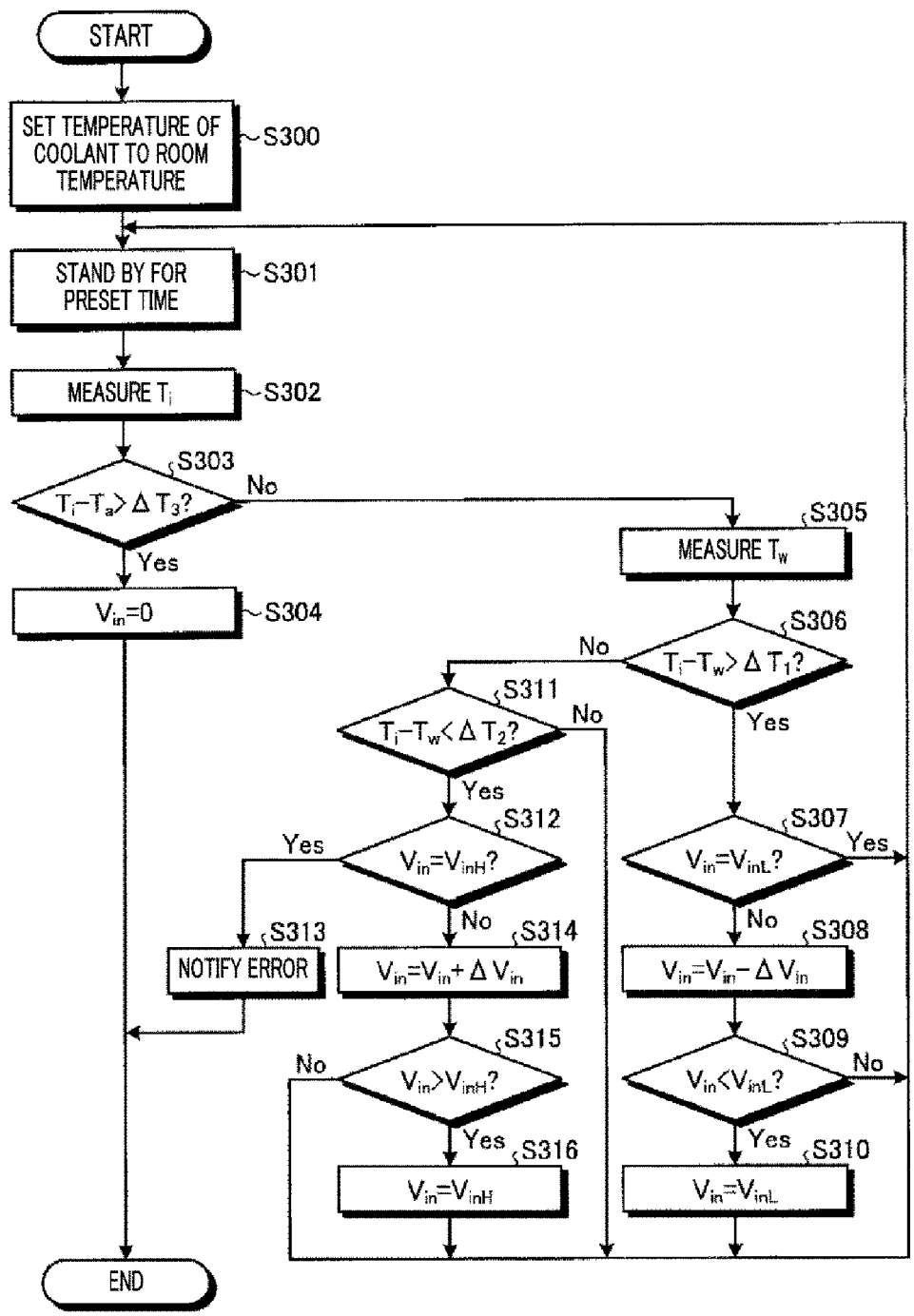
FIG. 7 is a flowchart illustrating an example of a post-processing process.

FIG. 7 is a flowchart illustrating an example of the post-processing process. Although FIG. 7 illustrates a processing in the single closed space ES, the same processing is performed in the other closed spaces ES.

First, the control device 11 sets the temperature of the coolant to a room temperature by outputting a control signal instructing the chiller unit CH to set the temperature of the coolant to the room temperature (S300). Then, the control device 11 stands by for a preset time (ranging from, for example, several seconds to several minutes) (S301). Then, the control device 11 measures the temperature $T_i$ of the low-temperature member 23 by acquiring data of the temperature $T_i$ of the surface of the low-temperature member 23, which is outputted from the temperature sensor 24 (S302). The process S302 is an example of a fourth measurement process.

Then, the control device 11 determines whether a value obtained by subtracting a dew-point temperature $T_a$ of the air within the clean room from the temperature $T_i$ of the low-temperature member 23 is larger than a third temperature difference $\Delta T_3$ (S303). The value of the dew-point temperature $T_a$ of the air within the clean room is previously stored in the memory of the control device 11. The process S303 is an example of a second determination process.

FIG. 8 provides an example of a dew-point temperature table. In the present exemplary embodiment, the temperature of the air within the clean room is regulated to, e.g., 25° C., and a humidity of the air within the clean room is controlled to, e.g., 50%. Referring to FIG. 8, a dew-point temperature of the air having the temperature of 25° C. and the humidity of 50% is found to be 13.9° C. In the memory of the control device 11, this data of, e.g., 13.9° C. is previously stored as the dew-point temperature $T_a$ of the air within the clean room.

Here, the third temperature difference $\Delta T_3$ will be discussed. The air within the clean room is managed to have the preset temperature and the preset humidity. Due to, however, a variation in the environment within the clean room or an error in the humidity control over the air supplied into the clean room, the humidity of the air within the clean room may be varied by ±10%. That is, in the present exemplary embodiment, the humidity of the air within the clean room may be varied within a range from 40% to 60%.

Referring to the dew-point temperature table of FIG. 8, at the temperature of 25° C., the dew-point temperature of the air having the humidity of 40% is 10.5° C., and the dew-point temperature of the air having the humidity of 60% is 16.7° C. Accordingly, the dew-point temperature of the air within the clean room may be varied by ±3.1° C. For the reason, if the value obtained by subtracting the dew-point temperature $T_a$ from the temperature $T_i$ of the low-temperature member 23 is equal to or less than 3.1° C., there is a likelihood that the condensation might occur. In the present exemplary embodiment, the third temperature difference $\Delta T_3$ is, e.g., 3.1° C.

If the value obtained by subtracting the dew-point temperature $T_a$ from the temperature $T_i$ of the low-temperature member 23 is larger than the third temperature difference $\Delta T_3$ (S303: Yes), the condensation does not take place on the surface of the low-temperature member 23 even if it is exposed to the air at the outside of the processing apparatus 10. Thus, the control device 11 outputs a control signal of setting the flow rate $V_{in}$ of the dry air supplied into the closed space ES to be zero (0) to the flow rate controller 73 (S304). As a result, the supply of the dry air into the closed space ES is stopped, and the processing shown in the present flowchart is ended. The process S304 is an example of a stopping process.

Meanwhile, if the value obtained by subtracting the dew-point temperature $T_a$ from the temperature $T_i$ of the low-temperature member 23 is equal to or less than the third temperature difference $\Delta T_3$ (S303: No), the control device 11 measures the dew-point temperature $T_w$ by acquiring data of the dew-point temperature $T_w$ outputted from the dew-point temperature sensor 25 (S305). The process S305 is an example of a fifth measurement process. Then, the control device 11 determines whether the value obtained by subtracting the dew-point temperature $T_w$ from the temperature $T_i$ of the low-temperature member 23 is larger than the first temperature difference $\Delta T_1$ (S306).

If the value obtained by subtracting the dew-point temperature $T_w$ from the temperature $T_i$ of the low-temperature member 23 is larger than the first temperature difference $\Delta T_1$ (S306: Yes), the control device 11 determines whether the flow rate $V_{in}$ of the dry air supplied into the closed space ES is the flow rate $V_{inL}$ (S307).

If the flow rate $V_{in}$ of the dry air is the flow rate $V_{inL}$ (S307: Yes), the control device 11 performs the process S301 again without changing the flow rate $V_{in}$ of the dry air. Meanwhile, if the flow rate $V_{in}$ of the dry air is not the flow rate $V_{inL}$ (S307: No), the control device 11 calculates the flow rate $V_{in}$ of the dry air which is reduced by the preset flow rate $\Delta V_{in}$ (S308). Then, the control device 11 determines whether the calculated flow rate $V_{in}$ is smaller than the flow rate $V_{inL}$ (S309).

If the calculated flow rate $V_{in}$ is equal to or larger than the flow rate $V_{inL}$ (S309: No), the control device 11 outputs a control signal indicating the calculated flow rate $V_{in}$ to the flow rate controller 73. Accordingly, the flow rate $V_{in}$ of the dry air supplied into the closed space ES is reduced by the preset flow rate $\Delta V_{in}$. Then, the control device 11 performs the process S301 again.

Meanwhile, if the calculated flow rate $V_{in}$ is smaller than the flow rate $V_{inL}$ (S309: Yes), the control device 11 generates a control signal instructing that the flow rate $V_{inL}$ is set as the flow rate $V_{in}$ (S310). Then, the control device 11 outputs the generated control signal to the flow rate controller 73. Accordingly, the flow rate $V_{in}$ of the dry air supplied into the closed space ES is adjusted to the flow rate $V_{inL}$. Then, the control device 11 performs the process S301 again. The processes S306, S308, S309 and S310 are an example of a third control process.

If the value obtained by subtracting the dew-point temperature $T_w$ from the temperature $T_i$ of the low-temperature member 23 is equal to or less than the first temperature difference $\Delta T_1$ (S306: No), the control device 11 determines whether the value obtained by subtracting the dew-point temperature $T_w$ from the temperature $T_i$ is smaller than the second temperature difference $\Delta T_2$ (S311). If the value obtained by subtracting the dew-point temperature $T_w$ from the temperature $T_i$ is equal to or larger than the second temperature difference $\Delta T_2$ (S311: No), that is, if the value obtained by subtracting the dew-point temperature $T_w$ from the temperature $T_i$ falls between the first temperature difference $\Delta T_1$ and the second temperature difference $\Delta T_2$, the control device 11 performs the process S301 again. In this case, the flow rate $V_{in}$ of the dry air is not changed.

Meanwhile, if the value obtained by subtracting the dew-point temperature $T_w$ from the temperature $T_i$ is smaller than the second temperature difference $\Delta T_2$ (S311: Yes), the control device 11 determines whether the flow rate $V_{in}$ of the dry air is the flow rate $V_{inH}$ (S312). If the flow rate $V_{in}$ of the dry air is the flow rate $V_{inH}$ (S312: Yes), the control device 11 notifies a manager of the processing system 1 of an error while maintaining the flow rate $V_{in}$ of the dry air to be the flow rate $V_{inH}$ (S313), and ends the processing shown in the present flowchart.

Meanwhile, if the flow rate $V_{in}$ of the dry air is not the flow rate $V_{inH}$ (S312: No), the control device 11 calculates the flow rate $V_{in}$ of the dry air increased by the preset flow rate $\Delta V_{in}$ (S314). Then, the control device 11 determines whether the calculated flow rate $V_{in}$ is larger than the flow rate $V_{inH}$ (S315). If the calculated flow rate $V_{in}$ is equal to or less than the flow rate $V_{inH}$ (S315: No), the control device 11 outputs a control signal indicating the calculated flow rate $V_{in}$ to the flow rate controller 73. Accordingly, the flow rate $V_{in}$ of the dry air supplied into the closed space ES is increased by the preset flow rate $\Delta V_{in}$. Then, the control device 11 performs the process S301 again.

Meanwhile, if the calculated flow rate $V_{in}$ is larger than the flow rate $V_{inH}$ (S315: Yes), the control device 11 generates a control signal instructing that the flow rate $V_{inH}$ is set as the flow rate $V_{in}$ (S316). Then, the control device 11 outputs the generated control signal to the flow rate controller 73. Accordingly, the flow rate $V_{in}$ of the dry air supplied into the closed space ES is adjusted to the flow rate $V_{inH}$. Then, the control device 11 performs the process S301 again.

So far, the first exemplary embodiment has been described. According to the processing system 1 of the present exemplary embodiment, the condensation on the member within the processing apparatus 10 can be suppressed.

Second Exemplary Embodiment

[Configuration of Processing System 1]

Figure 9:
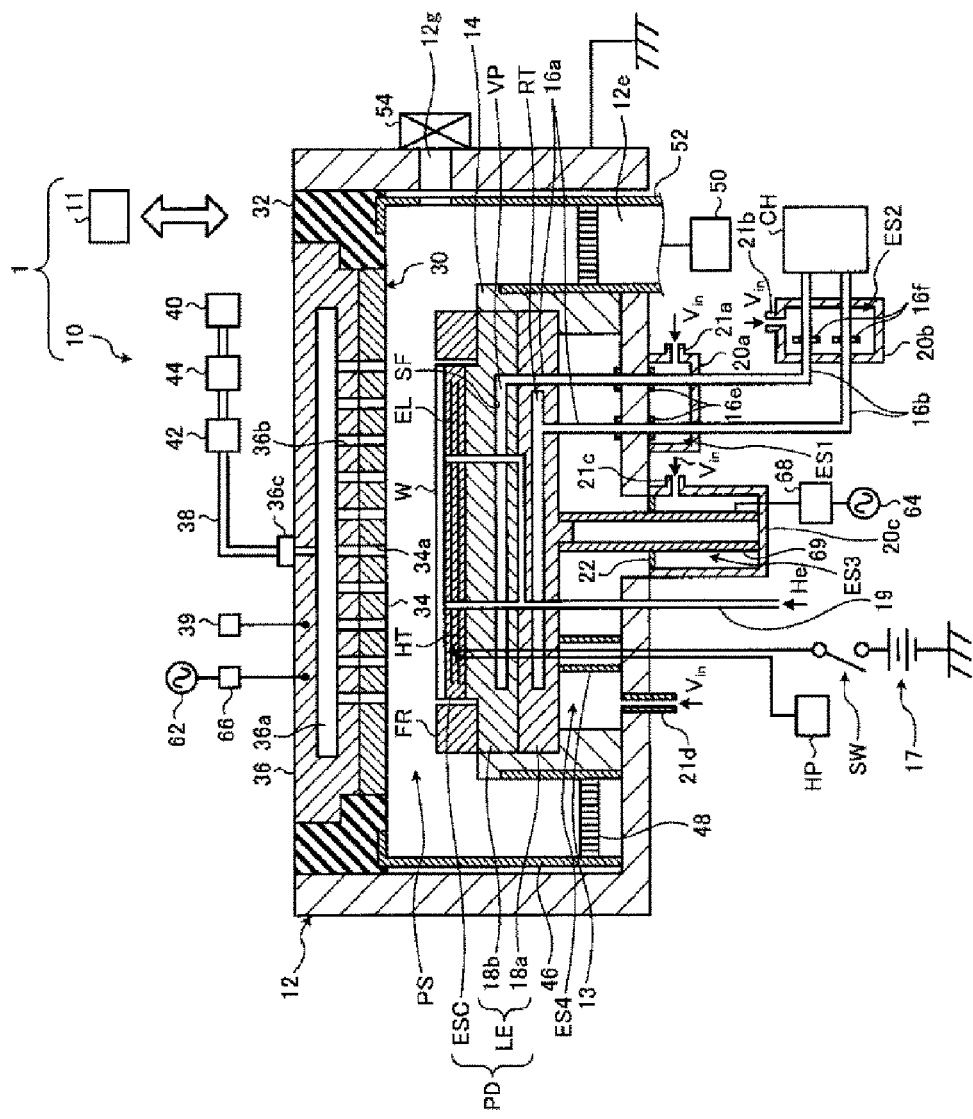
FIG. 9 is a configuration view illustrating an example of a processing system according to a second exemplary embodiment.

FIG. 9 is a configuration view illustrating an example of a processing system 1 according to a second exemplary embodiment. The processing system 1 includes a processing apparatus 10 and a control device 11. A configuration of a lower electrode LE of the processing apparatus 10 according to the present exemplary embodiment is different from the configuration of the lower electrode LE of the processing apparatus 10 according to the first exemplary embodiment. Further, in FIG. 9, members assigned the same reference numerals as those of FIG. 1 are the same as the members described in FIG. 1 except the following, so redundant description thereof will be omitted.

The processing apparatus 10 according to the second exemplary embodiment is equipped with a cooling system CS configured to cool the wafer W. Details of this cooling system CS will be elaborated later. The lower electrode LE according to the present exemplary embodiment includes a first plate 18a and a second plate 18b. The first plate 18a and the second plate 18b are made of a metal such as, but not limited to, aluminum, and have a substantially disk shape. The second plate 18b is provided on the first plate 18a and electrically connected with the first plate 18a. An electrostatic chuck ESC is provided on the second plate 18b.

An evaporation chamber VP is provided within the second plate 18b. The evaporation chamber VP cools the wafer W placed on the electrostatic chuck ESC by lowering the temperature of the electrostatic chuck ESC on a heat transfer wall SF of the evaporation chamber VP by heat of vaporization which is generated at the heat transfer wall SF of the evaporation chamber VP when the coolant is evaporated. A reservoir chamber RT is provided within the first plate 18a. The reservoir chamber RT stores therein the coolant which is supplied into the evaporation chamber VP. The internal pipes 16a are connected to the evaporation chamber VP and the reservoir chamber RT. The coolant from the chiller unit CH is supplied into the reservoir chamber RT via the internal pipe 16a, and this coolant is returned back into the chiller unit CH from the evaporation chamber VP via the internal pipe 16a.

Figure 10:
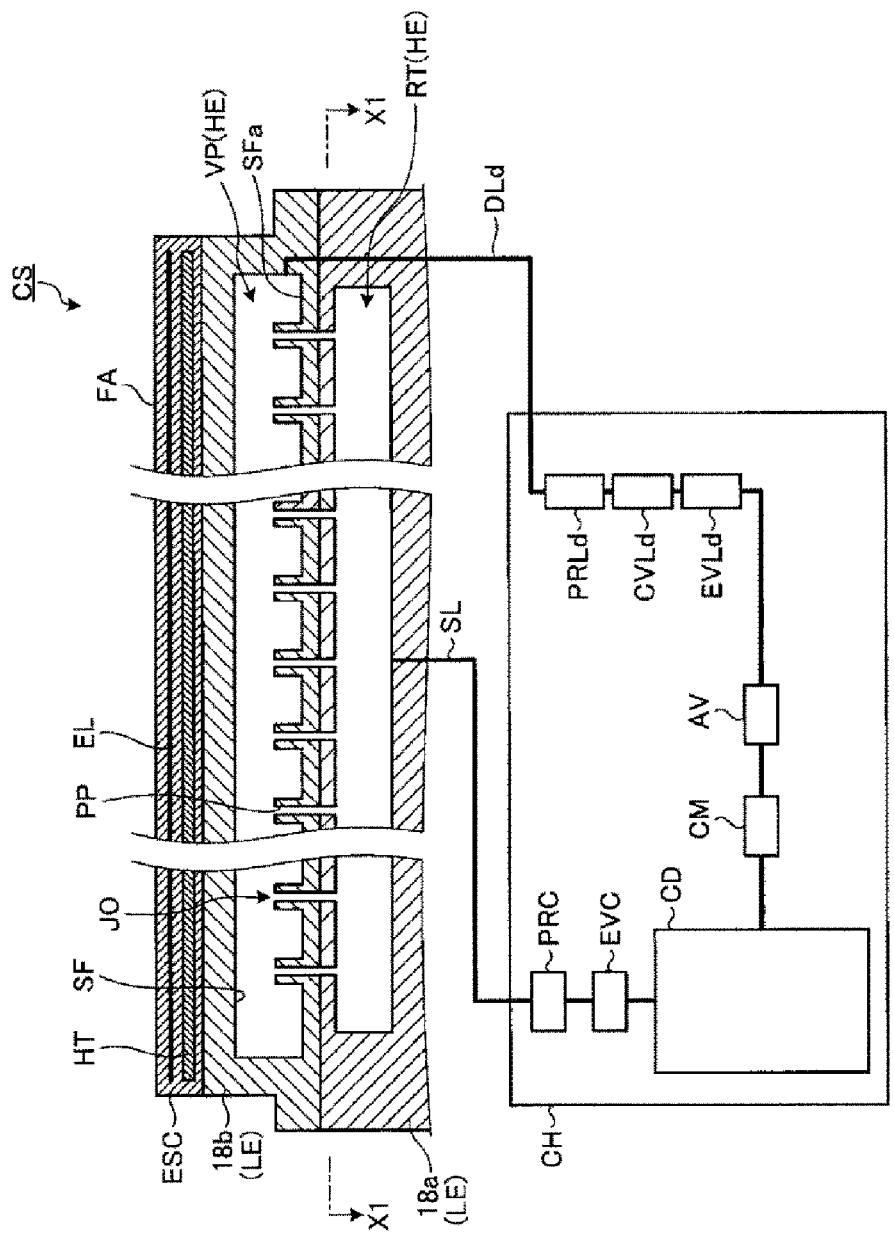
FIG. 10 is a diagram illustrating an example of a detailed configuration of a cooling system.

FIG. 10 is a diagram illustrating an example of a detailed configuration of the cooling system CS. The cooling system CS includes the chiller unit CH, a supply line SL (the internal pipe 16a and the external pipe 16b), a drain line DLd (the internal pipe 16a and the external pipe 16b), and a heat exchange unit HE.

The heat exchange unit HE is equipped with the evaporation chamber VP, the reservoir chamber RT and multiple pipes PP. Each pipe PP has a discharge hole JO. The reservoir chamber RT communicates with the evaporation chamber VP through the multiple pipes PP. The heat exchange unit HE is provided within the placing table PD and configured to perform heat exchange by the coolant via a placing surface FA of the placing table PD.

The evaporation chamber VP evaporates the coolant stored in the reservoir chamber RT. The evaporation chamber VP is connected to the chiller unit CH via the drain line DLd, extended along the placing surface FA of the placing table PD and includes multiple discharge holes JO. The discharge holes JO are respectively provided at one ends of the pipes PP and arranged such that the coolant is discharged toward the heat transfer wall SF at a side of the placing surface FA of inner walls of the evaporation chamber VP.

Figure 11:
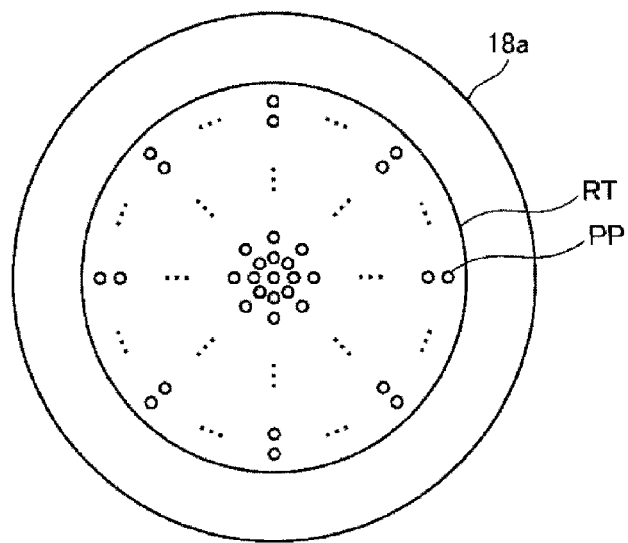
FIG. 11 is a diagram illustrating an example of a cross section of a lower electrode taken along a line X1-X1 shown in FIG. 10.

FIG. 11 is a diagram illustrating an example of a cross section of the lower electrode LE taken along a line X1-X1 of FIG. 10. On the cross section shown in FIG. 11, the multiple pipes PP (that is, the multiple discharge holes JO) are approximately equi-spaced in a circumferential direction and a diametrical direction of a circular cross section of the first plate 18a when viewed from above the placing surface FA. As illustrated in FIG. 11, when viewed from above the placing table FA, the multiple pipes PP (that is, the multiple discharge holes JO) are arranged to be distributed within the placing surface FA.

Reference is made back to FIG. 10. The chiller unit CH is connected to the heat exchange unit HE via the supply line SL of the coolant and the drain line DLd of the coolant. The chiller unit CH supplies the coolant to the heat exchange unit HE through the supply line SL and collects the coolant from the heat exchange unit HE through the drain line DLd.

The chiller unit CH is equipped with a pressure gauge PRLd, a check valve CVLd, an expansion valve EVLd, a regulation valve AV, a compressor CM, a condenser CD, an expansion valve EVC and a pressure gauge PRC. The evaporation chamber VP is provided in the second plate 18b, and the reservoir chamber RT is provided in the first plate 18a. The supply line SL connects the condenser CD and the reservoir chamber RT. The drain line DLd connects the condenser CD and the evaporation chamber VP.

In the chiller unit CH, the expansion valve EVC and the pressure gauge PRC are provided at the supply line SL in series in this sequence from the condenser CD side. In the chiller unit, the compressor CM, the regulation valve AV, the expansion valve EVLd, the check valve CVLd, and the pressure gauge PRLd are provided at the drain line DLd in series in this sequence from the compressor CD side.

An outlet of the condenser CD is connected to an inlet of the expansion valve EVC, and an outlet of the expansion valve EVC is connected to an inlet of the pressure gauge PRC. An outlet of the pressure gauge PRC is connected to the reservoir chamber RT. An inlet of the condenser CD is connected to an outlet of the compressor CM, and an inlet of the compressor CM is connected to an outlet of the regulation valve AV. An inlet of the regulation valve AV is connected to an outlet of the expansion valve EVLd, and an inlet of the expansion valve EVLd is connected to an outlet of the check valve CVLd. An inlet of the check valve CVLd is connected to an outlet of the pressure gauge PRLd, and an inlet of the pressure gauge PRLd is connected to the evaporation chamber VP. The drain line DLd is connected to a side of a bottom wall SFa of the evaporation chamber VP.

The degree of openness (%) of each of the expansion valve EVC, the regulation valve AV, the expansion valve EVLd, and the check valve CVLd is controlled by the control device 11.

Figure 12:
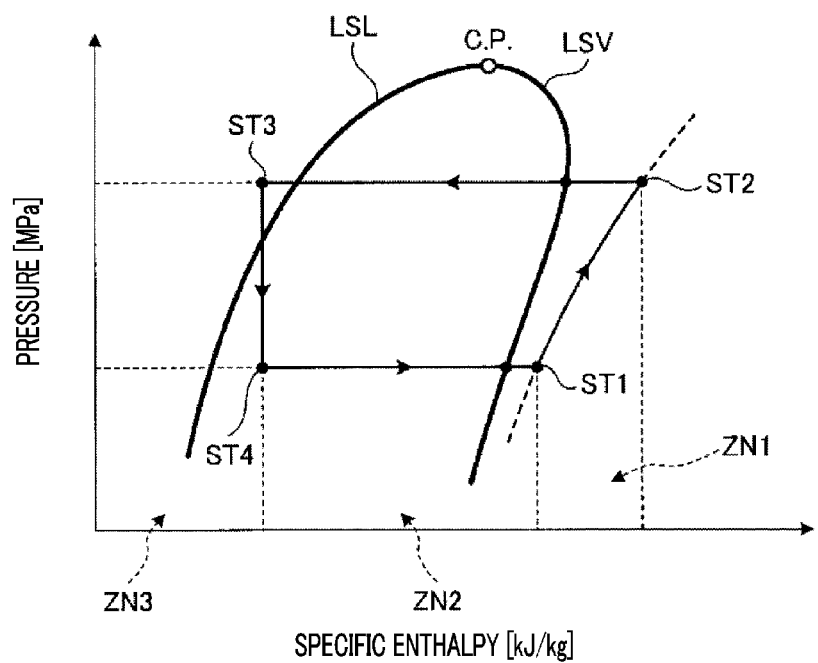
FIG. 12 provides a Mollier chart showing a cooling cycle of the cooling system.
Figure 13:
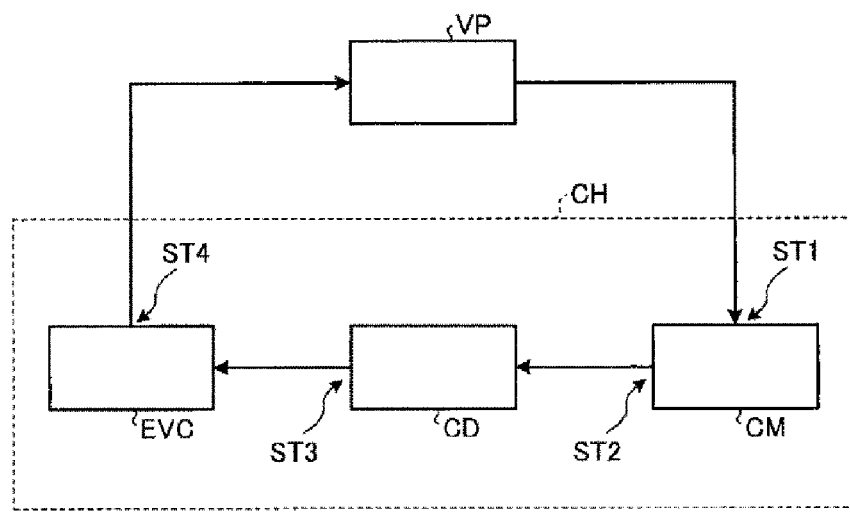
FIG. 13 is a diagram for describing the cooling cycle of the cooling system with reference to FIG. 12 as well.

Referring to FIG. 12 and FIG. 13, a cooling cycle of the cooling system CS will be explained. FIG. 12 provides a Mollier chart showing the cooling cycle of the cooling system CS. FIG. 13 is a diagram for describing the cooling cycle of the cooling system CS along with FIG. 12.

First, the coolant discharged from the evaporation chamber VP of the heat exchange unit HE comes into a state ST1 when it reaches the inlet of the compressor CM. The state ST1 is within a superheated vapor zone ZN1. The coolant is compressed along a constant specific entropy line by the compressor CM and comes into a state ST2 when it reaches the outlet of the compressor CM. The state ST2 is within the superheated vapor zone ZN1.

The coolant discharged from the compressor CM crosses a saturated vapor line LSV and a saturated liquid line LSL while being condensed along an isobar by the condenser CD, and comes into a state ST3 when it reaches the outlet of the condenser CD. The state ST3 is within a supercooling liquid zone ZN3. The coolant discharged from the condenser CD crosses the saturated liquid line LSL while being expanded by the expansion valve EVC along a constant specific enthalpy line and comes into a state ST4 when it reaches the outlet of the expansion valve EVC. The state ST4 is within a wet vapor zone ZN2.

The coolant discharged from the expansion valve EVC crosses the saturated vapor line LSV while being evaporated along the isobar in the evaporation chamber VP, and reaches the outlet of the evaporation chamber VP. The cooling system CS performs a heat exchange in the evaporation chamber VP through the circulation of the coolant in the above-described cooling cycle shown in FIG. 12 and FIG. 13.

So far, the second exemplary embodiment has been described. According to the processing system 1 of the present exemplary embodiment, the condensation on the member within the processing apparatus 10 can be suppressed. Further, the in-surface non-uniformity in heat release upon the wafer W placed on a surface of the placing table PD can be reduced with the cooling system CS according to the present exemplary embodiment.

OTHERS

The present disclosure is not limited to the above-described exemplary embodiments and can be modified in various ways within the scope of the present disclosure.

By way of example, in the above-described exemplary embodiments, if the value obtained by subtracting the dew-point temperature $T_w$ from the temperature $T_i$ of the low-temperature member 23 is equal to or less than the first temperature difference $\Delta T_1$ in the main-processing process and the post-processing process, the control device 11 reduces the flow rate $V_{in}$ of the dry air to the flow rate $V_{inL}$. However, the exemplary embodiments are not limited thereto. If the value obtained by subtracting the dew-point temperature $T_w$ from the temperature $T_i$ of the low-temperature member 23 is equal to or less than the first temperature difference $\Delta T_1$, the control device 11 may reduce the flow rate $V_{in}$ of the dry air to zero (0). In this case, the consumption of the dry air can be further reduced.

Furthermore, in the above-described exemplary embodiments, the flow rate $V_{in}$ of the dry air is increased or decreased by the preset flow rate $\Delta V_{in}$. However, the exemplary embodiments are not limited thereto. By way of example, in the increase and the decrease of the flow rate $V_{in}$ of the dry air, an increment and a decrement of the flow rate $V_{in}$ of the dry air per one time may be different.

In addition, the increment and the decrement of the flow rate $V_{in}$ of the dry air per one time may be varied depending on the value obtained by subtracting the dew-point temperature $T_w$ from the temperature $T_i$ of the low-temperature member 23. For example, as the value obtained by subtracting the dew-point temperature $T_w$ from the temperature $T_i$ of the low-temperature member 23 is larger, the decrement of the flow rate $V_{in}$ of the dry air per one time may be set to be larger. Further, as the value obtained by subtracting the dew-point temperature $T_w$ from the temperature $T_i$ of the low-temperature member 23 is smaller, the increment of the flow rate $V_{in}$ of the dry air per one time may be set to be larger.

Moreover, in the above-described exemplary embodiments, the processing system 1 generates the dry air from the air within the clean room by using the dry air supply device 70. However, the exemplary embodiments are not limited thereto. By way of non-limiting example, in case that dry air having a sufficiently low dew-point temperature is supplied into the clean room, the flow rate controller 73 configured to control the flow rate of the dry air supplied into the clean room may be provided in the processing system 1, instead of the dry air supply device 70.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A condensation suppressing method of suppressing condensation in a processing apparatus configured to perform a processing on a processing target object, the condensation suppressing method comprising:
   a first measurement process of measuring a first surface temperature of a member of the processing apparatus, the member being exposed within a closed space;
   a second measurement process of measuring a dew-point temperature of air within the closed space; and
   a first control process of controlling a supply amount of low-dew-point air, which has a dew-point temperature lower than a dew-point temperature of air outside the processing apparatus, into the closed space based on the first surface temperature and the dew-point temperature of the air within the closed space,
   wherein, in the first measurement process, a second surface temperature on a position on a surface of the member of the processing apparatus exposed within the closed space is measured, and a temperature obtained by subtracting, based on a previously measured temperature distribution of the surface of the member, a temperature difference between the position where the second surface temperature is measured and a position on the surface of the member having the lowest temperature from the second surface temperature is measured as the first surface temperature.

2. The condensation suppressing method of claim 1, wherein, in the first measurement process, a temperature of a portion, which has the lowest temperature, on a surface of the member of the processing apparatus exposed within the closed space is measured as the first surface temperature.

3. The condensation suppressing method of claim 1, wherein, in the first control process, the supply amount of the low-dew-point air into the closed space is decreased when a value obtained by subtracting the dew-point temperature of the air within the closed space from the first surface temperature is larger than a threshold value, and the supply amount of the low-dew-point air into the closed space is increased when the value obtained by subtracting the dew-point temperature of the air within the closed space from the first surface temperature is less than a second threshold value smaller than the first threshold value.

4. A condensation suppressing method of suppressing condensation in a processing apparatus configured to perform a processing on a processing target object, the condensation suppressing method comprising:
a first measurement process of measuring a first surface temperature of a member of the processing apparatus, the member being exposed within a closed space;
a second measurement process of measuring a dew-point temperature of air within the closed space;
a first control process of controlling a supply amount of low-dew-point air, which has a dew-point temperature lower than a dew-point temperature of air outside the processing apparatus, into the closed space based on the first surface temperature and the dew-point temperature of the air within the closed space; and
a pre-processing process performed before a cooling device configured to cool the member within the processing apparatus is operated,
wherein the pre-processing process comprises:
a third measurement process of measuring the dew-point temperature of the air within the closed space;
a first determination process of determining whether the dew-point temperature of the air within the closed space is less than a preset temperature;
a second control process of increasing the supply amount of the low-dew-point air into the closed space when the dew-point temperature of the air within the closed space is equal to or higher than the preset temperature; and
an operation starting process of starting an operation of the cooling device when the dew-point temperature of the air within the closed space is less than the preset temperature, and
wherein the first measurement process, the second measurement process and the first control process are performed after the pre-processing process is performed.

5. The condensation suppressing method of claim 4, further comprising:

a post-processing process performed after the cooling device configured to cool the member within the processing apparatus is stopped,
wherein the post-processing process comprises:
a fourth measurement process of measuring the first surface temperature;
a fifth measurement process of measuring the dew-point temperature of the air within the closed space;
a third control process of controlling the supply amount of the low-dew-point air into the closed space, based on the first surface temperature and the dew-point temperature of the air within the closed space;
a second determination process of determining whether to stop the supply of the low-dew-point air into the closed space, based on the first surface temperature and the dew-point temperature of the air outside the processing apparatus; and
a stopping process of stopping the supply of the low-dew-point air into the closed space, based on a determination result in the second determination process.

6. The condensation suppressing method of claim 1, further comprising:
an introduction process of introducing the air outside the processing apparatus; and
a generation process of generating the low-dew-point air by removing moisture of the introduced air.

7. A processing system, comprising:
a processing apparatus configured to perform a processing on a processing target object;
a first measuring unit configured to measure a first surface temperature of a member of the processing apparatus, the member being exposed within a closed space;
a second measuring unit configured to measure a dew-point temperature of air within the closed space; and
a control unit configured to control a supply amount of low-dew-point air, which has a dew-point temperature lower than a dew-point temperature of air outside the processing apparatus, into the closed space, based on the surface temperature and the dew-point temperature of the air within the closed space,
wherein the first measuring unit is configured to measure a second surface temperature on a position on a surface of the member of the processing apparatus exposed within the closed space is measured, and a temperature obtained by subtracting, based on a previously measured temperature distribution of the surface of the member, a temperature difference between the position where the second surface temperature is measured and a position on the surface of the member having the lowest temperature from the second surface temperature is measured as the first surface temperature.

8. The processing system of claim 7, further comprising:
a housing configured to form the closed space by surrounding the member of the processing apparatus.

* * * * *